(12) United States Patent
Morikado

(10) Patent No.: US 8,358,537 B2
(45) Date of Patent: Jan. 22, 2013

(54) NONVOLATILE SEMICONDUCTOR MEMORY DEVICE

(75) Inventor: Mutsuo Morikado, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/235,410

(22) Filed: Sep. 18, 2011

(65) Prior Publication Data

US 2012/0069653 A1    Mar. 22, 2012

(30) Foreign Application Priority Data

Sep. 22, 2010  (JP) ................. P2010-212843

(51) Int. Cl.
*G11C 11/34*  (2006.01)
*G11C 16/04*  (2006.01)

(52) U.S. Cl. ......... 365/185.03; 365/185.17; 365/185.18; 365/185.24

(58) Field of Classification Search ............. 365/185.03, 365/185.17, 185.18, 185.24
See application file for complete search history.

(56) References Cited

U.S. PATENT DOCUMENTS

| 8,238,159 B2 * | 8/2012 | Morikado | 365/185.17 |
|---|---|---|---|
| 2005/0157558 A1 * | 7/2005 | Noguchi et al. | 365/185.22 |
| 2008/0219058 A1 * | 9/2008 | Shibata et al. | 365/185.24 |
| 2009/0052239 A1 | 2/2009 | Joe et al. | |
| 2010/0208519 A1 * | 8/2010 | Shiga et al. | 365/185.03 |
| 2011/0069546 A1 * | 3/2011 | Watanabe | 365/185.03 |
| 2011/0075483 A1 | 3/2011 | Morikado | |
| 2011/0235413 A1 * | 9/2011 | Kamigaichi | 365/185.03 |

FOREIGN PATENT DOCUMENTS

| JP | 2009-48755 | 3/2009 |
|---|---|---|
| JP | 2011-70724 | 4/2011 |

* cited by examiner

*Primary Examiner* — Ly D Pham
(74) *Attorney, Agent, or Firm* — Oblon, Spivak, McClelland, Maier & Neustadt, L.L.P.

(57) ABSTRACT

A nonvolatile semiconductor memory device according to one embodiment includes: a memory cell array; word lines each connected to nonvolatile memory cells; and a control circuit. When executing the data reading operation, the control circuit applies to a selected word line connected to a selected memory cell a first voltage obtained by adding a first adjusting voltage to an intermediate voltage between adjoining two of the threshold voltage distributions; applies to first non-selected word lines adjoining the selected word line a second voltage obtained by subtracting a second adjusting voltage from a reading pass voltage; applies to second non-selected word lines adjoining the first non-selected word lines a third voltage obtained by adding the second adjusting voltage to the reading pass voltage; and applies to third non-selected word lines, the third non-selected word lines being non-selected word lines except the first and second non-selected word lines, the reading pass voltage.

20 Claims, 7 Drawing Sheets

A-A' Cross Section

B-B' Cross Section

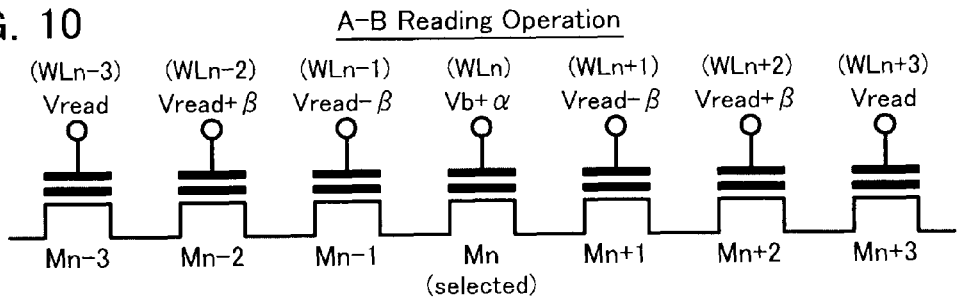
FIG. 10 A-B Reading Operation
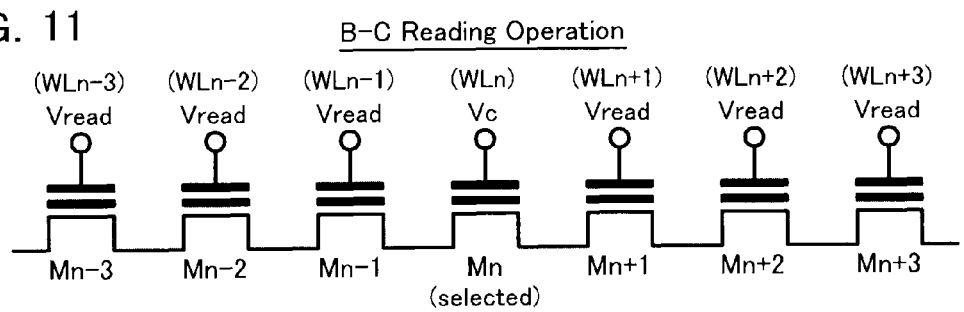
FIG. 11 B-C Reading Operation
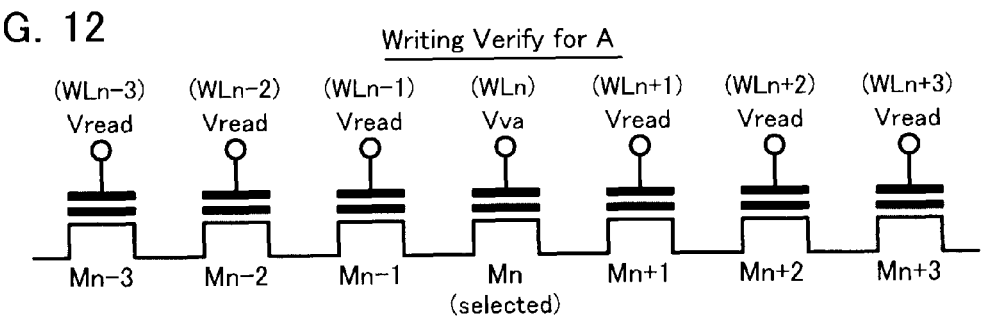
FIG. 12 Writing Verify for A
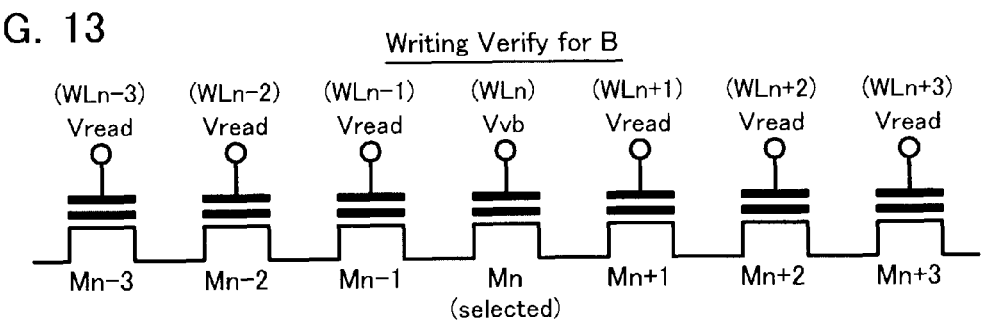
FIG. 13 Writing Verify for B
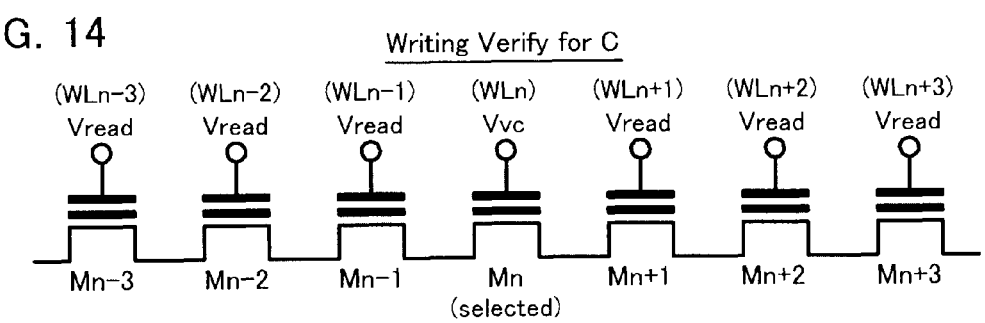
FIG. 14 Writing Verify for C

NONVOLATILE SEMICONDUCTOR MEMORY DEVICE

CROSS REFERENCE TO RELATED APPLICATIONS

This application is based on and claims the benefit of priority from prior Japanese Patent Application No. 2010-212843, filed on Sep. 22, 2010, the entire contents of which are incorporated herein by reference.

BACKGROUND

1. Field

Embodiments described herein relate generally to a nonvolatile semiconductor memory device.

2. Description of the Related Art

Current NAND type flash memories include a floating gate electrode in each memory cell and execute writing or erasing by charging or discharging electrons into or from the floating gate electrode. It is possible to set a plurality of threshold voltage states (data states) by controlling the amount of electrons to be charged into the floating gate electrode. In recent years, NAND type flash memories for storing 2 bits (4 values) or 3 bits (8 values) in one memory cell have been developed and mass-produced.

In a NAND type flash memory, the threshold voltage of a memory cell changes depending on the amount of electrons charged into the floating gate electrode. In a reading operation, a certain voltage (an intermediate voltage between a plurality of threshold voltage distributions) is applied to a selected word line, while a reading pass voltage Vread (a voltage that makes the memory cells conductive regardless of the data stored in the memory cells) is applied to non-selected word lines. The reading operation is executed by determining whether or not a current flows through a NAND cell unit in response to the application of these voltages.

In order to let flow a sufficient current through non-selected memory cells, the reading pass voltage Vread is set even higher than the upper limit value of the highest threshold voltage distribution by approximately 2 V. In recent years in which miniaturization has advanced, it has been occurring that the potential of the floating gate electrode of a selected memory cell rises due to influence of the reading pass voltage Vread applied to adjoining non-selected word lines. Hence, there occurs a phenomenon that the threshold voltage of the selected memory cell seems as if it has become lower. As a result, the selected memory cell which should not become conductive in response to the threshold voltage of the data retained therein becomes conductive, posing a risk that erroneous data might be read out.

Moreover, with the advancement of miniaturization, there may also occur a phenomenon that a threshold voltage distribution seems to be wider due to influence of charges that have been left around the floating gate electrode of a selected memory cell since a writing or erasing operation. When the threshold voltage distribution becomes wider at its upper limit side, the selected memory cell which should become conductive in response to the threshold voltage of the data retained therein does not become conductive, also posing a risk that erroneous data might be read out.

BRIEF DESCRIPTION OF THE DRAWINGS

FIG. 10 is a diagram explaining an operation scheme of the nonvolatile semiconductor memory device according to the first embodiment.

FIG. 11 is a diagram explaining an operation scheme of the nonvolatile semiconductor memory device according to the first embodiment.

FIG. 12 is a diagram explaining an operation scheme of the nonvolatile semiconductor memory device according to the first embodiment FIG. 13 is a diagram explaining an operation scheme of the nonvolatile semiconductor memory device according to the first embodiment.

FIG. 14 is a diagram explaining an operation scheme of the nonvolatile semiconductor memory device according to the first embodiment.

DETAILED DESCRIPTION

Figure 1:
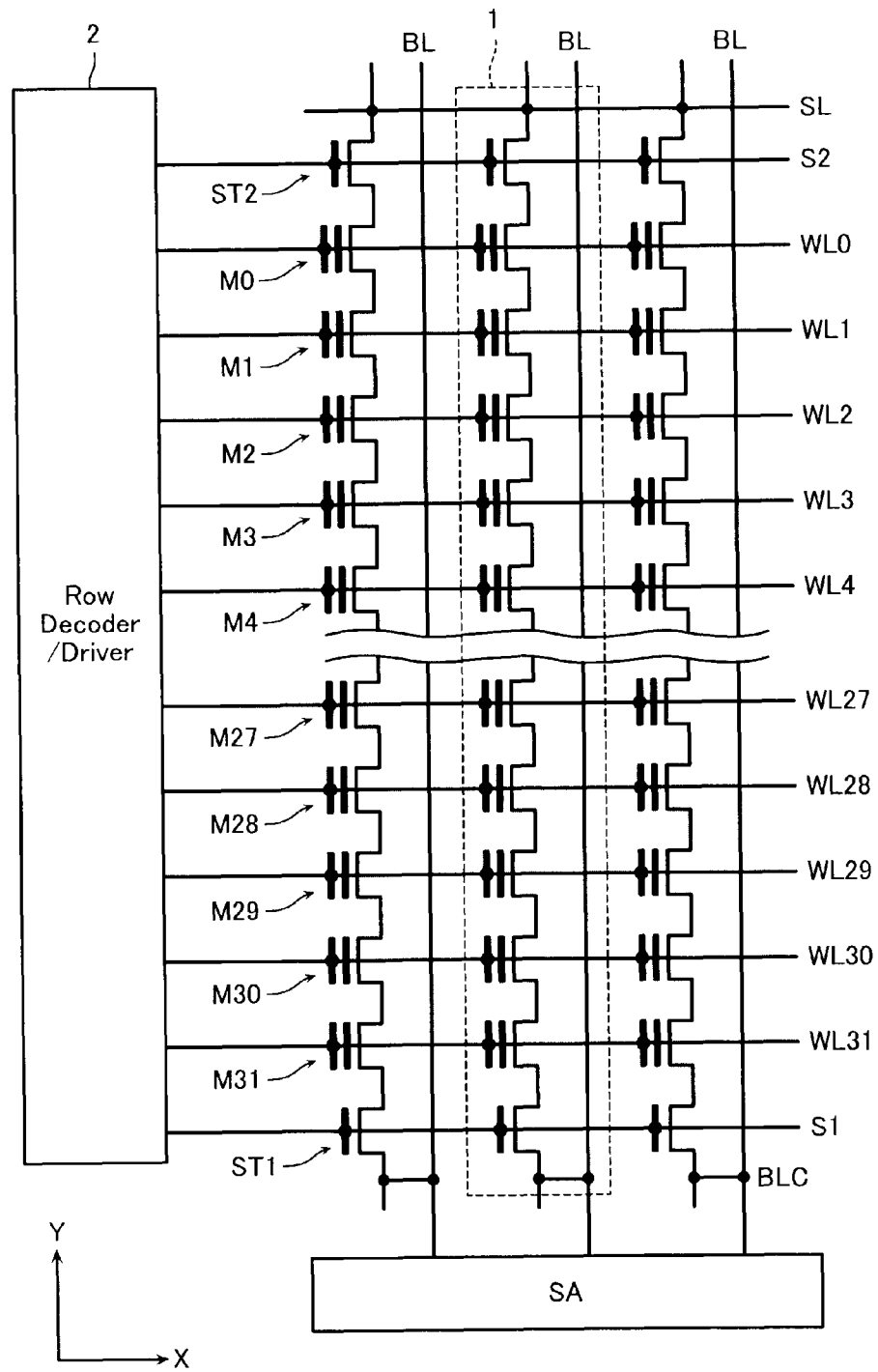
FIG. 1 is an equivalent circuit diagram showing a memory cell array of a nonvolatile semiconductor memory device according to a first embodiment.

A nonvolatile semiconductor memory device according to one embodiment of the present invention includes: a memory cell array including an array of NAND cell units, each of the NAND cell units further including a memory string and select transistors connected to both ends of the memory string, the memory string including a plurality of nonvolatile memory cells connected in series; word lines each connected to the nonvolatile memory cells; bit lines connected to first ends of the NAND cell units respectively; a source line connected to a second ends of the NAND cell units; and a control circuit configured to select one of the nonvolatile memory cells as a selected memory cell to control a data reading operation on the selected memory cell. The nonvolatile memory cells are configured to have a plurality of threshold voltage distributions assigned to plural types of data to be stored therein. The control circuit is configured to, when executing the data reading operation, apply to a selected word line, the selected word line being a word line connected to a selected memory cell, a first voltage obtained by adding a first adjusting voltage having a certain voltage value to an intermediate voltage between an upper limit value and a lower limit value of adjoining two of the threshold voltage distributions; apply to first non-selected word lines, the first non-selected word lines being word lines adjoining the selected word line, a second voltage obtained by subtracting a second adjusting voltage having a certain voltage value from a reading pass voltage for making the nonvolatile memory cells conductive regardless of a type of the plurality of threshold voltage distributions of the memory cells; apply to second non-selected word lines, the second non-selected word lines being word lines adjoining the first non-selected word lines, a third voltage obtained by adding the second adjusting voltage to the reading pass voltage; and apply to third non-selected word lines, the third non-selected word lines being non-selected word lines except the first non-selected word lines and the second non-selected word lines, the reading pass voltage.

The embodiments of the present invention will now be explained in detail with reference to the drawing. In the descriptions to be made in the following embodiments regarding the drawings, any portions that have the same configuration will be denoted by the same reference numerals, and redundant explanations about such portions will not be made. In the following embodiments, the nonvolatile semiconductor memory device will be explained as a NAND type flash memory using memory cells having a stacked-gates configuration. However, this configuration is a mere example, and needless to say, the present invention is not limited to this configuration.

First Embodiment

Configuration of Nonvolatile Semiconductor Memory Device According to First Embodiment The configuration of a nonvolatile semiconductor memory device according to a first embodiment will be explained with reference to FIG. 1 to FIG. 3B. First, the configuration of a NAND type flash memory according to the present embodiment will be explained.

FIG. 1 is an equivalent circuit diagram showing a portion of a memory cell array formed in a memory cell region of the NAND type flash memory. A NAND cell unit 1 of the NAND type flash memory includes two select gate transistors ST1 and ST2 and a plurality of memory cells Mn (n=0 to 31) connected in series between the select gate transistors ST1 and ST2. In the NAND cell unit 1, the plurality of memory cells Mn form a memory string with a source region of a given memory cell Mn shared as a drain region of its adjoining memory cell Mn. The memory cell array includes a plurality of NAND cell units 1 in a matrix arrangement.

Control gate electrodes of a plurality of memory cells Mn arranged in the X direction of FIG. 1 are connected commonly by a word line WLn (n=0 to 31). Gate electrodes of a plurality of select gate transistors ST1 arranged in the X direction of FIG. 1 are connected commonly by a select gate line S1, and gate electrodes of the select gate transistors ST2 are connected commonly by a select gate line S2. A bit line contact BLC is connected to a drain region of the select gate transistor ST1. The bit line contact BLC is connected to a bit line BL extending in the Y direction of FIG. 1. The select gate transistors ST2 are connected to a source line SL extending in the X direction of FIG. 1 through their source regions. A sense amplifier circuit SA used for reading and writing of cell data is disposed at one end of the bit lines BL. A row decoder/driver 2 configured to select and drive the word lines WL and the select gate lines S1 and S2 is disposed at one end of the word lines WL.

The memory cell Mn has N-type source/drain regions formed in a P-type well of a silicon substrate, and has a stacked-gates configuration including a control gate electrode and a floating gate electrode functioning as a charge accumulation layer. The NAND type flash memory changes the amount of charges to be accumulated in the floating gate electrode by a writing operation or an erasing operation, thereby changing the threshold voltage of the memory cell Mn to store one-bit or multi-bit data in one memory cell. In the NAND type flash memory, an aggregate of a plurality of NAND cell units 1 sharing the same word lines WL configures a block. In the NAND type flash memory, erasing of data is executed by this block basis.

Figure 2:
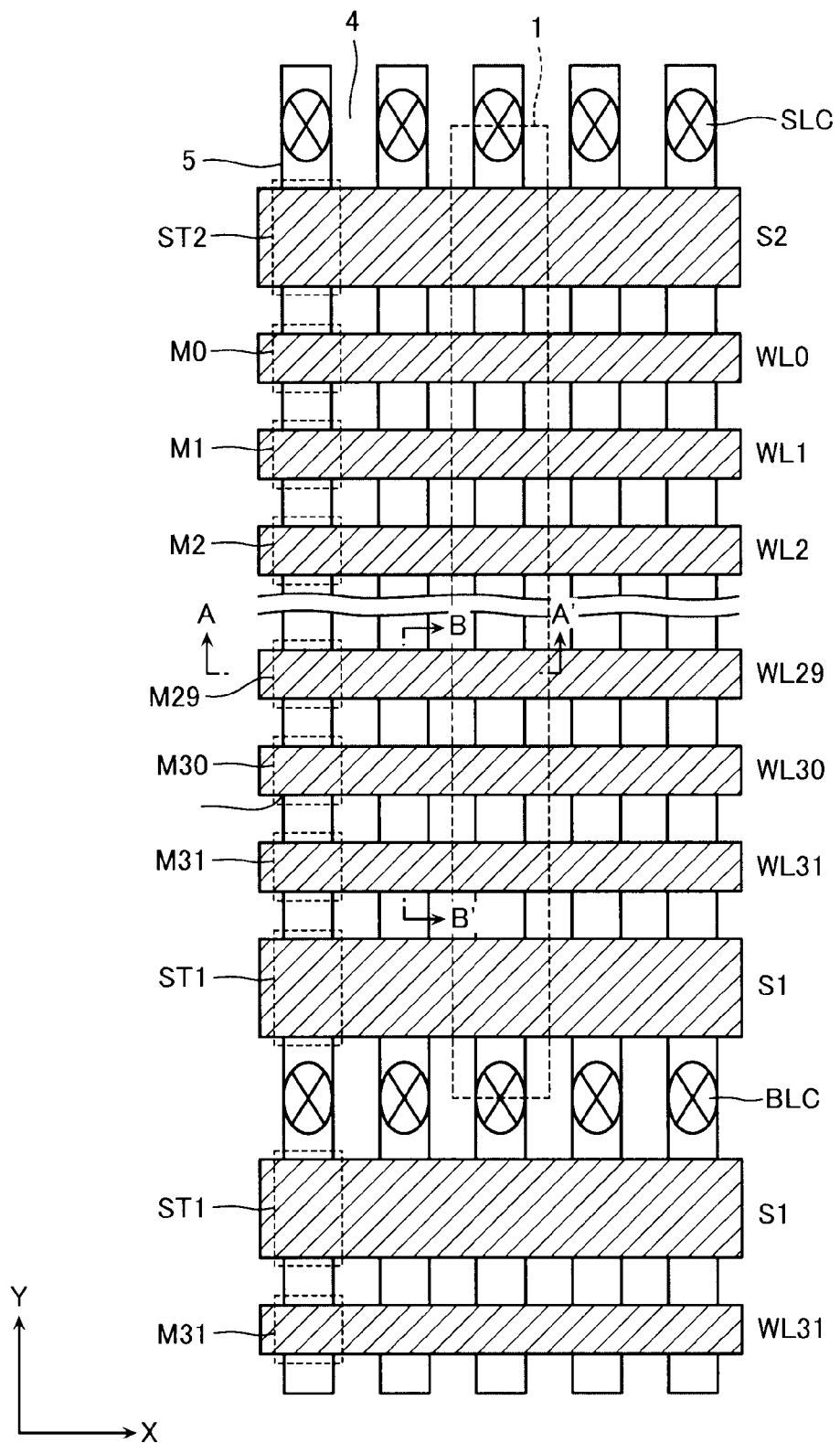
FIG. 2 is a layout diagram of the memory cell array of the nonvolatile semiconductor memory device according to the first embodiment.

FIG. 2 is a layout diagram showing a portion of the memory cell array formed in the memory cell region of the NAND type flash memory.

As shown in FIG. 2, a plurality of element isolation regions 4 each having a STI (Shallow Trench Isolation) configuration are formed in a silicon substrate, i.e., a semiconductor substrate at certain intervals to extend in the Y direction of FIG. 2. Hence, element regions 5 are formed as separated from each other in the X direction of FIG. 2. Word lines WLn of the memory cells Mn are formed at certain intervals to extend in the X direction of FIG. 2 orthogonal to the element regions 5. The portions of the word line WLn that are above the element regions 5 intersect with the word line WLn function as the control gate electrodes of the memory cells Mn. The select gate line S1 of the select gate transistors ST1 is formed to extend in the X direction of FIG. 2. The portions of the select gate line S1 that are above the element regions 5 intersect with the select gate line S1 function as the gate electrodes of the select gate transistors ST1. The bit line contacts BLC are formed in the portions of the element regions 5 that are between adjoining select gate lines S1. The bit line contacts BLC are connected to the bit lines BL (unillustrated) extending in the Y direction of FIG. 2. The select gate line S2 of the select gate transistors ST2 is formed to extend in the X direction of FIG. 2. The portions of the select gate line S2 that are above the element regions 5 intersect with the select gate line S2 function as the gate electrodes of the select gate transistors ST2. Source line contacts SLC are formed in the portions of the element regions 5 that are between adjoining select gate lines S2. The source line contacts SLC are connected to the source line SL (unillustrated) extending in the X direction of FIG. 2.

Figure 3A:
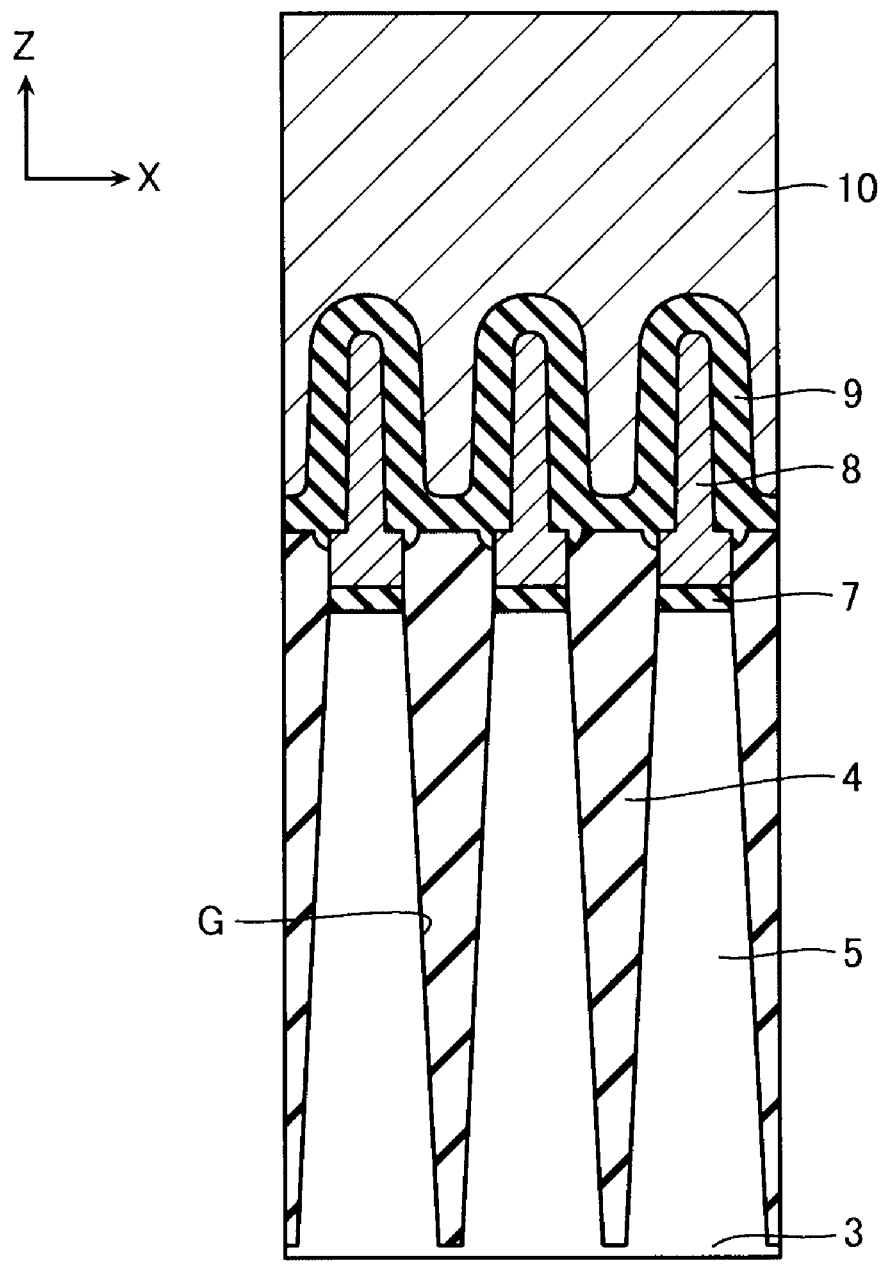
FIG. 3A is a cross-sectional diagram of the memory cell array of the nonvolatile semiconductor memory device according to the first embodiment.
Figure 3B:
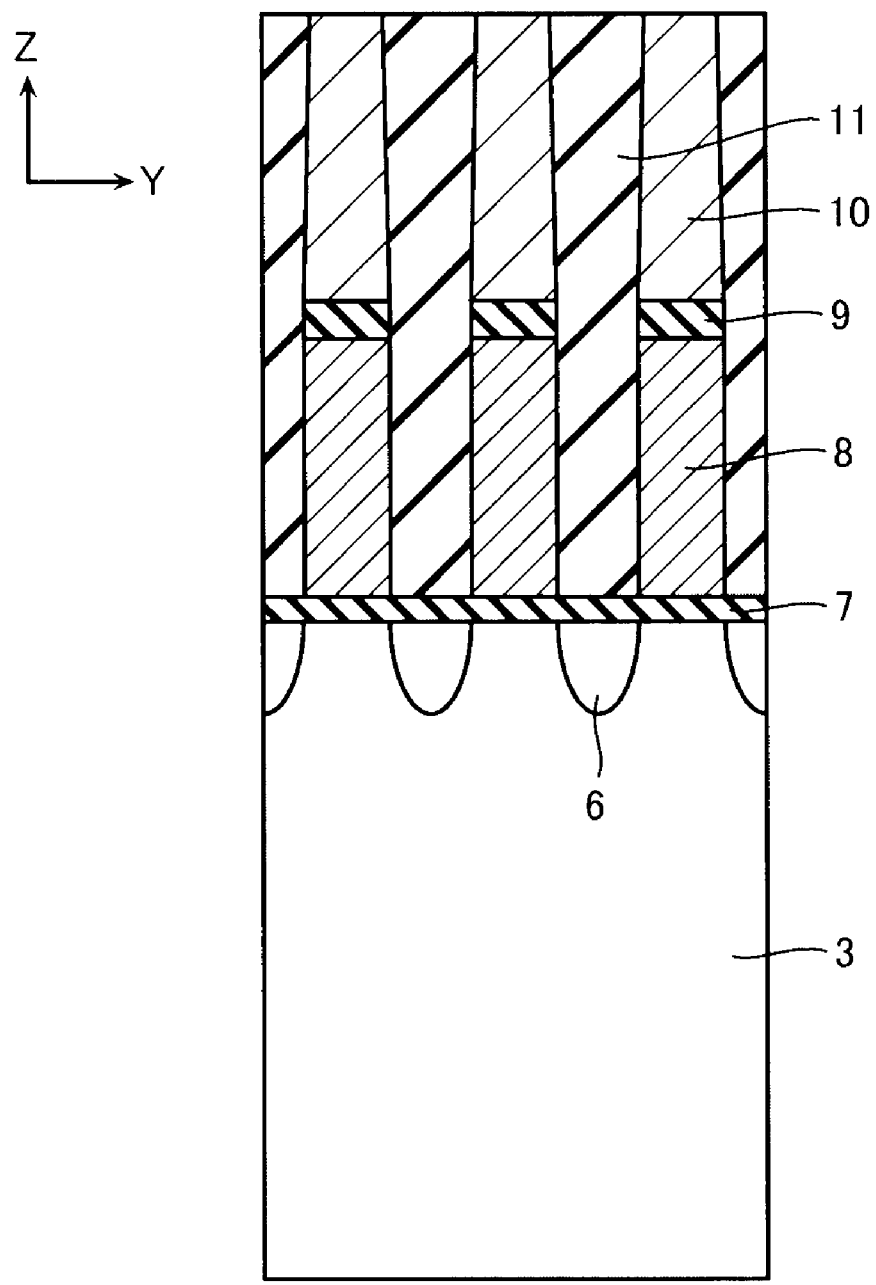
FIG. 3B is a cross-sectional diagram of the memory cell array of the nonvolatile semiconductor memory device according to the first embodiment.

FIG. 3A and FIG. 3B are cross-sectional diagrams of FIG. 2 taken along a line A-A' and a line B-B' respectively.

As shown in FIG. 3A, element isolation trenches G are formed in the surface of a silicon substrate 3. The element isolation regions 4 are formed with the element isolation trenches G filled with an insulating film. In the memory cell array according to the present embodiment, the silicon substrate 3 separated by the plurality of element isolation regions 4 having the STI configuration functions as the element regions 5. Each element isolation region 4 is formed to have a top surface that is higher than the top surface of the element region 5 and lower than the top surface of the floating gate electrode 8. An inter-gate insulating film 9 is formed continuously in the X direction of FIG. 3A. The control gate electrode 10 is provided to traverse the element isolation regions 4 through the inter-gate insulating film 9.

As shown in FIG. 3B, a tunnel insulating film 7 having a thickness of 4 nm to 16 nm is formed above the silicon substrate 3. The floating gate electrode 8, the inter-gate insulating film 9, and the control gate electrode 10 of the memory cells Mn are stacked sequentially through the tunnel insulating film 7. The floating gate electrode 8 and the control gate electrode 10 are made of, for example, polycrystalline silicon film. The inter-gate insulating film 9 has, for example, an ONO configuration made of a silicon oxide film, a silicon nitride film, and a silicon oxide film, or an NONON configuration made of an ONO configuration further sandwiched between silicon nitride films. Source/drain regions 6 are formed in the portions of the surface layer (i.e., the surface) of the silicon substrate 3 that are between the floating gate electrodes 8. The source/drain region 6 is made of, for example, an impurity diffusion region. The source/drain region 6 is formed to be shared by adjoining memory cells Mn. For example, a silicon oxide film 11 is formed between the floating gate electrodes 8 and between the control gate electrodes 10 so as to fill the space between the electrodes.

Figure 4:
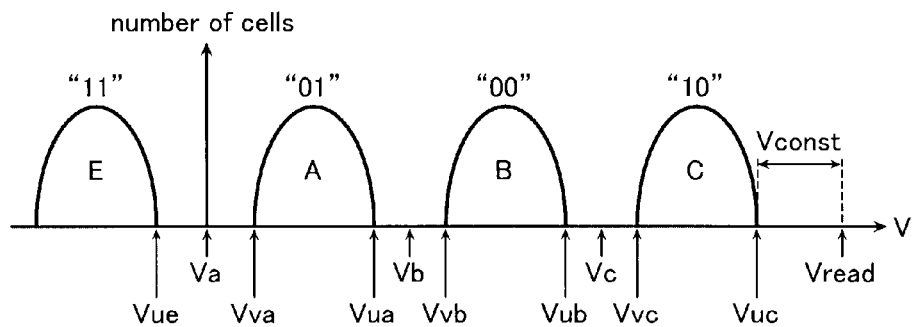
FIG. 4 is a diagram showing one example of threshold voltage distributions retained by memory cells Mn in the nonvolatile semiconductor memory device according to the first embodiment.

FIG. 4 is a diagram showing one example of threshold voltage distributions retained by the memory cells Mn in the NAND type flash memory according to the present embodiment. When the NAND type flash memory stores four-value data (2 bits per cell), threshold voltage distributions of the data are as shown in FIG. 4, for example. In this case, there are four kinds of threshold voltage distributions (E, A, B, and C) having threshold voltages ascending in the order of E, A, B, and C. These threshold voltage distributions E, A, B, and C are assigned data "11", "01", "00", and "10" respectively. The threshold voltage distribution E represents a negative threshold voltage state obtained by an erasing operation.

[Erasing Operation]

In the NAND type flash memory, a data erasing operation is normally executed on a block basis. In a data erasing operation, an erasing pulse voltage Vera (approximately 10 V to 30 V) is applied to the silicon substrate 3, and 0 V is applied to all the word lines WL in the selected block. This causes a FN tunnel current which causes the charges in the floating gate electrode 8 of each memory cell Mn to be discharged into the cell well of the silicon substrate 3 to thereby lower the threshold voltage of the memory cells Mn.

[Writing Operation]

A writing operation is executed on the basis of a page defined as an aggregate of memory cells connected to one word line WL. Prior to a writing operation, the bit line BL is pre-charged to a voltage corresponding to the data to be written.

Specifically, when writing data of the threshold voltage distribution A, B, or C, the sense amplifier circuit SA applies 0 V to the bit line BL. This bit line voltage is transferred to the channel of the selected memory cell Mn connected to the selected word line WLn through the select gate transistor ST1 and non-selected memory cells.

In the writing operation, a writing voltage Vpgm (approximately 10 V to 25 V) is applied to the selected word line WLn in the selected block. A writing pass voltage Vpass (approximately 5 V to 15 V) is applied to the non-selected word lines WL, and a voltage Vdd is applied to the select gate line S2. This writing operation causes charges to be charged from the channel of the selected memory cell Mn to the floating gate electrode 8 thereof, to shift the threshold voltage of the selected memory cell Mn to the positive side.

On the other hand, when writing no data in the selected memory cell Mn, the sense amplifier circuit SA applies a voltage Vdd to the bit line BL. This bit line voltage Vdd is transferred to the channel of the NAND cell unit 1 through the select gate transistor ST1 and non-selected memory cells, after which the select gate transistor ST1 changes to a non-conductive state to bring the channel into a floating state. This prevents electron charge into the floating gate electrode 8 even when the writing voltage Vpgm or the writing pass voltage Vpass described above is applied to the word line WL, because the channel voltage rises due to a capacitance coupling. Hence, the threshold voltage distribution of the selected memory cell Mn does not shift, and no data is written.

[Writing Verify Operation]

After a writing operation by application of the writing voltage Vpgm is executed, a verify reading operation (a writing verify operation) is executed to confirm whether the threshold voltage of the selected memory cell Mn becomes a voltage equal to or higher than the lower limit value of the threshold voltage distribution corresponding to the data which should be written. In the writing verify operation, a reading pass voltage Vread (approximately 3 V to 8 V) is applied to the word lines WL connected to non-selected memory cells and the select gate lines S1 and S2.

The voltage Vdd is applied to the bit line BL, and 0 V is applied to the source line SL. A writing verify voltage (a voltage Vva, Vvb, or Vvc shown in FIG. 4) is applied to the word line WL connected to the selected memory cell Mn. The sense amplifier circuit SA determines the data by detecting whether or not a current flows through the NAND cell unit 1 at this time. As shown in FIG. 4, the writing verify voltage Vva, Vvb, or Vvc is set to the lower limit value of the threshold voltage distribution corresponding to the data which should be written in the selected memory cell Mn.

When the desired data has been written in the selected memory cell Mn, the above-described writing verify operation causes no current to flow through the NAND cell unit 1. On the other hand, when the threshold voltage of the selected memory cell Mn does not reach the desired threshold voltage distribution, a current flows through the NAND cell unit 1. When determining that the desired data is written in the selected memory cell Mn, the writing into the selected memory cell Mn is done sufficiently, to thereby complete the writing operation. When the desired data is not written in the selected memory cell Mn, a writing operation is executed in the selected memory cell Mn again.

[Reading Operation]

First, a data reading operation according to a comparative example will be explained. In a data reading operation according to the comparative example, any of voltages Va, Vb, and Vc, which are each an intermediate voltage between the upper limit value and the lower limit value of adjoining two of the plurality of threshold voltage distributions E, A, B, and C, is applied to the control gate (i.e., the word line WLn) of a selected memory cell Mn in a NAND cell unit 1. The voltage Va is an intermediate voltage between the upper limit value and the lower limit value of the threshold voltage distributions E and A, and the lowest voltage of the voltages Va, Vb, and Vc. The voltage Vb is higher than the voltage Va, and an intermediate voltage between the upper limit value and the lower limit value of the threshold voltage distributions A and B. The voltage Vc is higher than the voltage Vb, and an intermediate voltage between the upper limit value and the lower limit value of the threshold voltage distributions B and C. The upper limit value of each of the threshold voltage distributions E, A, B, and C is a value estimated based on, for example, a step-up width of the writing voltage Vpgm, the degree of miniaturization of the memory cells, and other factors, while the lower limit value is a value estimated based on the writing verify voltage Vva, Vvb, or Vvc. Intermediate values between these estimated values are set as the reading voltages Va, Vb, and Vc described above.

A reading pass voltage Vread (approximately 3 V to 8 V) is applied to the word lines WL connected to non-selected memory cells. The reading pass voltage Vread is a voltage which makes the non-selected memory cells conductive regardless of the data retained in the non-selected memory cell to let flow a sufficient amount of current through the non-selected memory cells. For example, the reading voltage Vread may be set to a voltage having a value obtained by adding a certain margin Vconst to the upper limit value Vuc (an estimated value) of the threshold voltage distribution C.

The sense amplifier circuit SA detects whether or not a current flows through the NAND cell unit 1 when, as described above, the reading voltage Va, Vb, or Vc is applied to the selected word line WL and the reading pass voltage Vread is applied to the non-selected word lines. The data reading operation is executed by detecting which of the intermediate voltages Va, Vb, and Vc, when applied to the selected word line WL, causes a current to flow through the NAND cell unit 1.

The reading operation in the NAND type flash memory according to the comparative example is as described above. However, the reading operation in the NAND type flash memory according to the comparative example has the following two problems. First, with the advancement of miniaturization of the memory cells, the reading pass voltage Vread may influence the threshold voltage distribution of the selected memory cell to seem as if it has become lower, which might result in erroneous reading. Second, charges trapped in the inter-layer insulating film, etc. influence the threshold voltage distribution of the selected memory cell to seem wider, which might result in erroneous reading. Such erroneous reading may be error-corrected by an ECC circuit provided separately, but error correction involves a risk of substantial slowdown of the reading speed. These problems will now be discussed in turn.

The first problem will now be described in detail.

Figure 5:
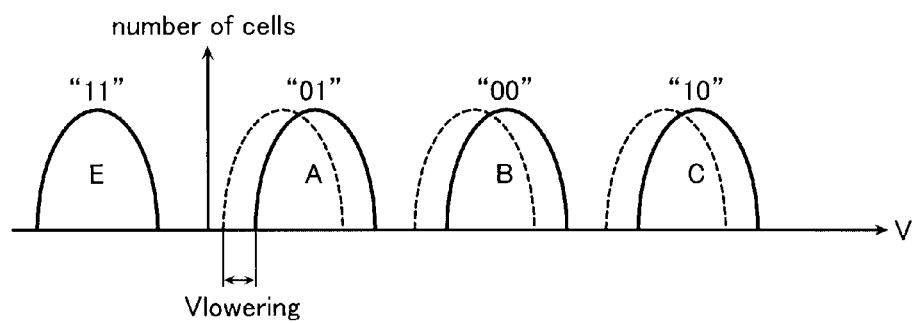
FIG. 5 is a diagram explaining a problem of a nonvolatile semiconductor memory device according to a comparative example.
Figure 6:
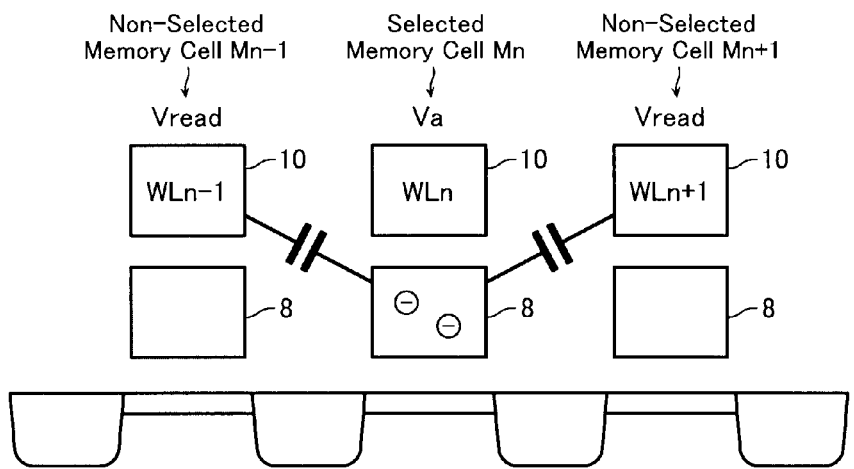
FIG. 6 is a diagram explaining a problem of the nonvolatile semiconductor memory device according to the comparative example.

FIG. 5 and FIG. 6 are diagrams explaining the first problem of the NAND type flash memory. In order to let flow a sufficient current through non-selected memory cells in a reading operation, the reading pass voltage Vread is set to a voltage higher than the highest threshold voltage (i.e., the upper limit value Vuc of the threshold voltage distribution C shown in FIG. 4) by a voltage Vconst (e.g., approximately 2 V). As shown in FIG. 6, the voltage of the floating gate electrode 8 of the selected memory cell Mn rises by coupling not only with the control gate electrode 10 of selected memory cell Mn applied with the intermediate voltage Va but also with the control gate electrodes 10 of the adjoining non-selected memory cells Mn+1 and Mn−1. This phenomenon becomes remarkable as the miniaturization of the memory cells advances. Therefore, an attempt to read from the selected memory cell Mn by applying the voltage Va to the control gate electrode 10 thereof ends up in a state that a voltage higher than the voltage Va is applied to the selected memory cell Mn. As a result, the threshold voltage distribution of the selected memory cell Mn seems as if it has become lower. Hence, the threshold voltage distributions of the data retained by the NAND type flash memory shift to the negative direction as shown by broken lines in FIG. 5.

Here, a rate of capacitance coupling between the selected memory cell Mn and one adjoining memory cell Mn+1 (or Mn−1) is defined as $C_{neighbor}$. The amount of shift $V_{lowering}$ of the threshold voltage distribution due to the reading pass voltage Vread applied to the adjoining memory cells Mn+1 and Mn−1 is defined as $V_{lowering}=2 \times Vread \times C_{neighbor}$. If a data reading operation is executed in this state, the threshold voltage distribution of the selected memory cell Mn might not be read out correctly. For example, even when the selected memory cell Mn retains data corresponding to the threshold voltage distribution A, the selected memory cell Mn might become conductive in response to the intermediate voltage Va due to influence of the voltage Vread applied to the adjoining non-selected memory cells Mn+1 and Mn−1, which leads to erroneous reading with the threshold voltage distribution A mistaken for the threshold voltage distribution E.

Figure 7:
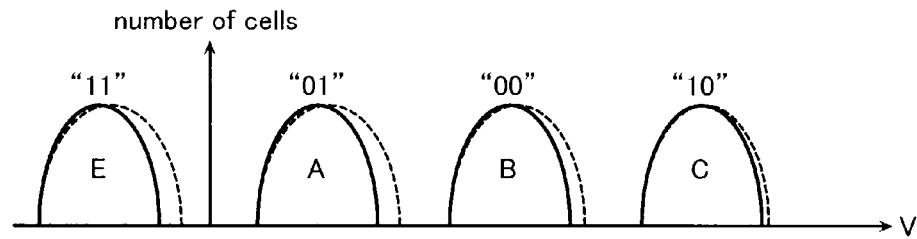
FIG. 7 is a diagram explaining a problem of the nonvolatile semiconductor memory device according to the comparative example.
Figure 8:
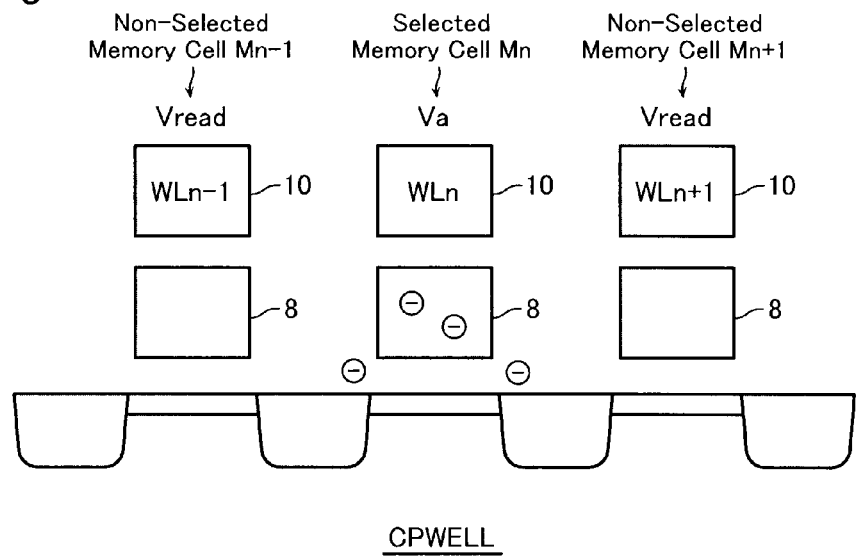
FIG. 8 is a diagram explaining a problem of the nonvolatile semiconductor memory device according to the comparative example.

Next, the second problem will be described in detail. FIG. 7 and FIG. 8 are diagrams explaining the second problem of the NAND type flash memory.

As shown in FIG. 8, in a writing or erasing operation, there are cases when charges are trapped in the inter-layer insulating film or the gate insulating film located around the floating gate electrode 8 of the selected memory cell Mn and left therein. The trapped charges make it harder for a current to flow through the silicon substrate 3 when the intermediate voltage Va is applied to the selected memory cell Mn. For example, even when scarce charges corresponding to the threshold voltage distribution E are charged in the floating gate electrode 8 of the selected memory cell Mn, the selected memory cell Mn might not become conductive in response to the voltage Va.

This is represented as a state that the threshold voltage distributions seem wider in the positive direction as shown by broken lines in FIG. 7. The lower the voltage to be applied to the control gate electrode 10 of the selected memory cell Mn, the more influential the charges left around the floating gate electrode 8 become. Therefore, the width of widening of the distribution becomes the largest when reading the data corresponding to the threshold voltage distribution E, and the width of widening of the distribution in the reading operation descends in the order of the threshold voltage distributions A, B, and C. When the threshold voltage distributions become wider at the upper limit side, a selected memory cell Mn which should become conductive in response to the threshold voltage of the data retained therein does not become conductive, which might result in erroneous data being read out.

To solve these problems, the nonvolatile semiconductor memory device according to the present embodiment executes the following reading operation.

[Operation of Nonvolatile Semiconductor Memory Device According to First Embodiment]

Figure 9:
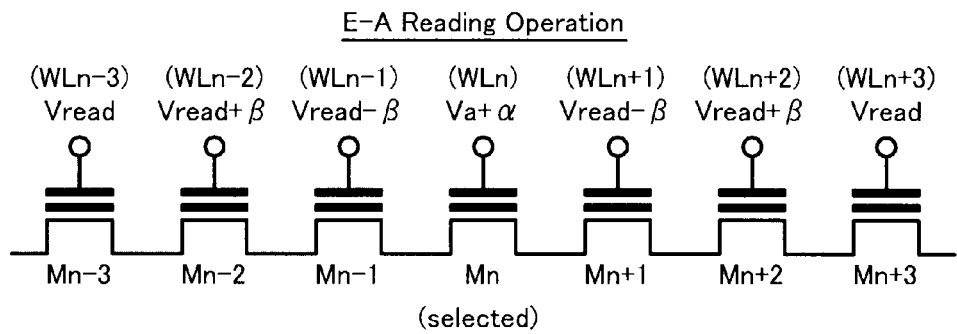
FIG. 9 is a diagram explaining an operation scheme of the nonvolatile semiconductor memory device according to the first embodiment.

FIG. 9 to FIG. 11 show states of voltages being applied to the word lines WL in a NAND cell unit 1 in a reading operation of the NAND type flash memory according to the present embodiment. In the present embodiment, explanation will be given on the basis that the four-value data shown in FIG. 4 are stored in the memory cells Mn.

FIG. 9 shows voltages to be applied to the respective portions when executing a reading operation (E-A reading operation) for determining whether the selected memory cell Mn retains the threshold voltage distribution E or any of the threshold voltage distributions A, B, and C. FIG. 10 shows voltages to be applied to the respective portions when executing a reading operation (A-B reading operation) for determining whether the selected memory cell Mn retains the threshold voltage E or A or the threshold voltage B or C. FIG. 11 shows voltages to be applied to the respective portions when executing a reading operation (B-C reading operation) for determining whether the selected memory cell Mn retains the threshold voltage distribution E, A, or B, or the threshold voltage distribution C.

As shown in FIG. 9, when executing an E-A reading operation, a voltage Va+α, which is the sum of the intermediate voltage Va and an adjusting voltage α having a certain value, is applied to the selected word line WLn connected to the selected memory cell Mn. This is the difference from the comparative example where the intermediate voltage Va is applied to the selected word line WLn. Here, the adjusting voltage α satisfies α>0 V (e.g., α=0.3 V). Though not shown in FIG. 9, a voltage Vsg which is enough to make the select gate transistors ST conductive is applied to the select gate lines S1 and S2.

Meanwhile, the reading pass voltage Vread is not applied to all the non-selected word lines WL, but the following voltages are supplied to the non-selected word lines WL according to their position with respect to the selected memory cell Mn. A voltage Vread−β lower than the reading pass voltage Vread by an adjusting voltage β having a certain value is applied to the non-selected word lines WLn+1 and WLn−1 adjoining the selected word line WLn on both sides thereof. In the case of four-value data storage, the reading pass voltage Vread is set to a value (e.g., 6 V) higher than the upper limit value of the threshold voltage distribution C. The adjusting voltage β is 1 V, for example.

A voltage Vread+β higher than the reading pass voltage Vread by the adjusting voltage β is applied to the non-selected word lines WLn+2 and WLn−2 adjoining the non-selected word lines WL+1 and WLn−1 respectively. Application of the non-selected word line voltage Vread−β described above might not be able to make the non-selected memory cells Mn+1 and Mn−1 conductive if the threshold voltage of the non-selected memory cells Mn+1 and Mn−1 is in the highest threshold voltage distribution C. However, application of the voltage Vread+β to the non-selected word lines WLn+2 and WLn−2 causes capacitance coupling to the non-selected memory cells Mn+1 and Mn−1, which hence become conductive regardless of the data retained therein, even though the voltage applied to the non-selected word lines WLn+1 and WLn−1 is the voltage Vread−β. Hence, no trouble occurs in the reading operation.

The reading pass voltage Vread which makes the non-selected memory cells conductive regardless of the data retained therein is applied to the non-selected word lines WLn+3 and WLn−3 adjoining the non-selected word lines WLn+2 and WLn−2 respectively and to the remaining non-selected word lines WL.

The voltage values specified above are mere examples in the reading operation, and it is only necessary that the voltage values of the respective voltages satisfy a relationship Va+α<Vread−β<Vread<Vread+β. The NAND type flash memory according to the present embodiment applies these voltages to the word lines WL in order to execute a data reading operation in which an intermediate voltage between the threshold voltage distributions E and A is applied.

Next, as shown in FIG. 10, when executing an A-B reading operation, a voltage Vb+α, which is the sum of the intermediate voltage Vb and the adjusting voltage α, is applied to the selected word line WLn connected to the selected memory cell Mn. Though not shown in FIG. 10, a voltage Vsg enough to make the select gate transistors ST conductive is applied to the select gate lines S1 and S2.

The voltages to be applied to the non-selected word lines WL are like the example shown in FIG. 9. That is, the reading pass voltage Vread is not applied to all the non-selected word lines WL, but voltages corresponding to their position with respect to the selected memory cell Mn are supplied to them. A voltage Vread−β lower than the reading pass voltage Vread by the adjusting voltage β is applied to the non-selected word lines WLn+1 and WLn−1 adjoining the selected word line WLn on both sides thereof. A voltage Vread+β higher than the reading pass voltage Vread by the adjusting voltage β is applied to the non-selected word lines WLn+2 and WLn−2 adjoining the non-selected word lines WLn+1 and WLn−1 respectively. The reading pass voltage Vread which makes the non-selected memory cells conductive regardless of the data is applied to the non-selected word lines WLn+3 and WLn−3 adjoining the non-selected word lines WLn+2 and WLn−2 respectively and to the remaining non-selected word lines WL.

The voltage values specified above are mere examples in the reading operation, and it is only necessary that the voltage values of the respective voltages applied to the word lines WL satisfy a relationship Vb+α<Vread−β<Vread<Vread+β. The NAND type flash memory according to the present embodiment executes the A-B reading operation by applying these voltages to the word lines WL.

Next, as shown in FIG. 11, when executing a B-C reading operation, the intermediate voltage Vc is applied to the selected word line WLn connected to the selected memory cell Mn. Here, the voltage Vc is an intermediate voltage (e.g., 3 V) between the upper limit value and the lower limit value of the threshold voltage distributions B and C. When executing a B-C reading operation in the nonvolatile semiconductor memory device according to the present embodiment, the voltage Vc is applied to the selected memory cell Mn instead of a voltage Vc+α, which is the sum of the voltage Vc and the adjusting voltage α. This is the difference from the E-A reading operation and the A-B reading operation where the voltage Va+α and the voltage Vb+α are applied to the selected memory cell Mn. Though not shown in FIG. 11, a voltage Vsg enough to make the select gate transistors ST conductive is applied to the select gate lines S1 and S2.

Furthermore, when executing a B-C reading operation, the reading pass voltage Vread is applied to all the non-selected word lines WL. This is the difference from the E-A reading operation and the A-B reading operation where the voltage Vread−β is applied to the non-selected word lines WLn+1 and WLn−1 and the voltage Vread+β is applied to the non-selected word lines WLn+2 and WLn−2.

The voltage Vread−β in the examples shown in FIG. 9 and FIG. 10 is set to satisfy Vc<Vread−β.

[Effect of Nonvolatile Semiconductor Memory Device According to First Embodiment]

In the NAND type flash memory according to the present embodiment shown in FIG. 9 and FIG. 10, the voltage Vread−β lower than the reading pass voltage Vread is applied to the non-selected word lines WLn+1 and WLn−1 adjoining the selected word line WLn. Hence, in the NAND type flash memory according to the present embodiment, shifting of the threshold voltage distribution of the selected memory cell Mn is suppressed as compared with when the normal reading pass voltage Vread is applied to the non-selected word lines WLn+1 and WLn−1. Specifically, the amount of shift $V_{lowering}'$ of the threshold voltage distribution due to the voltage Vread−β applied to the adjoining memory cells Mn+1 and Mn−1 is calculated as $V_{lowering}' = 2 \times (Vread−β) \times C_{neighbor}$. Therefore, the shifting of the threshold voltage distribution can be suppressed to smaller by $2 \times β \times C_{neighbor}$ than the amount of shift $V_{lowering}$ of the threshold voltage distribution due to the voltage Vread.

Simulation conducted by a self-manufactured simulator on a NAND type flash memory having a minimum line width of approximately 34 nm reveals that when the voltage of the non-selected word lines WLn+1 and WLn−1 adjoining the selected word line WLn rises by 1 V, the threshold voltage distribution of the selected memory cell Mn seems as if it has become lower by 0.3 V, according to a finding of the inventors. According to the present embodiment, the voltage to be applied to the non-selected word lines WLn+1 and WLn−1 is lower than the reading pass voltage Vread by the adjusting voltage β (approximately 1 V). Shifting of the threshold voltage distribution of the selected memory cell Mn is suppressed by approximately 1×0.3=0.3 V, i.e., 300 my. This eliminates the need of setting the writing voltage to be applied to the selected word line WL in a data writing operation excessively high to charge many electrons into the floating gate electrode 8. Hence, it is possible to provide a NAND type flash memory which allows data to be read out accurately from a selected memory cell at no risk of deteriorating the reliability of the memory cells.

The NAND type flash memory according to the present embodiment shown in FIG. 9 and FIG. 10 applies a voltage higher than the intermediate voltage Va or Vb between the upper limit value and the lower limit value of the threshold voltage distributions E and A or A and B by the adjusting voltage α to the selected word line WLn. When charges are left around the floating gate electrode of the selected memory cell Mn, the threshold voltage distributions seem wider as shown in FIG. 7. Therefore, a reading operation executed by applying the intermediate voltage Va or Vb might suffer a reduced margin from the upper limit value of the threshold voltage distribution E or the threshold voltage distribution A or might result in erroneous data being read out. However, in the reading operation of the NAND type flash memory according to the present embodiment, a voltage Va+α or Vb+α higher than the intermediate voltage Va or Vb is applied to the selected word line WLn. This enables data to be read out accurately with a margin secured from the upper limit value of the threshold voltage distribution E or the threshold voltage distribution A.

Here, when executing a reading operation by applying a voltage between the threshold voltage distributions B and C shown in FIG. 11, the adjusting voltage α is not added to the intermediate voltage Vc to be applied to the selected word line WLn, and the reading pass voltage Vread is applied to all of the non-selected word lines. This is because the widening of the threshold voltage distributions gives a greater influence at a lower reading voltage as shown in FIG. 7. Hence a reading operation executed by applying the voltage Vc is at a lower risk of erroneous data being read out even without the adjusting voltage α, because inter-cell interference effect caused by the voltage Vread and charges trapped in the inter-layer insulating film, etc. give a relatively small influence on the reading operation.

In the embodiment described above, it is necessary that the adjusting voltage α be lower than ½ of a voltage represented by a width between the upper limit value and the lower limit value of two threshold voltage distributions. This is because if the adjusting voltage α is higher than ½ of the voltage represented by the width between the upper limit value and the lower limit value of two threshold voltage distributions, the voltage to be applied to the selected word line WLn in the reading operation reach a value in the threshold voltage distribution.

Furthermore, it is preferable that the adjusting voltage α satisfy a relationship $α \leq 2 \times β \times C_{neighbor}$. This is because if a voltage higher than $Va+2 \times β \times C_{neighbor}$ is applied to the selected memory cell Mn, there is little or no meaning in suppressing the inter-cell interference effect by reducing the voltage to be applied to the non-selected word lines WLn−1 and WLn+1 from the voltage Vread to the voltage Vread−β.

Moreover, it is necessary that the adjusting voltage β be such a voltage that makes the voltage Vread−β higher than the intermediate voltages Va, Vb, and Vc, and makes the voltage Vread+β lower than the voltage Vpgm to be applied to the selected word line WLn in a writing operation. This is for preventing the non-selected memory cell from being written erroneously.

[Example of Another Operation of Nonvolatile Semiconductor Memory Device According to First Embodiment]

FIG. 12 to FIG. 14 show states of voltages applied to the word lines WL in a NAND cell unit 1 in a writing verify operation of the NAND type flash memory according to the present embodiment. In a writing verify operation, a voltage having the lower limit value of the threshold voltage distribution A, B, or C is applied to the control gate (i.e., the selected word line WLn) of the selected memory cell Mn to determine whether or not the desired data is written in the selected memory data Mn. FIG. 12 shows an example of reading whether or not data having the threshold voltage distribution A has been written in the selected memory cell Mn. FIG. 13 shows an example of reading whether or not data having the threshold voltage distribution B has been written in the selected memory cell Mn. FIG. 14 shows an example of reading whether or not data having the threshold voltage distribution C has been written in the selected memory cell Mn.

As shown in FIG. 12, in a verify operation for reading whether or not data having the threshold voltage distribution A is written or not, the voltage Vva (e.g., 0.5 V) having the lower limit value of the threshold voltage distribution A is applied to the selected word line WLn connected to the selected memory cell Mn. Though not shown in FIG. 12, a voltage Vsg enough to make the select gate transistors ST conductive is applied to the select gate lines S1 and S2.

The reading pass voltage Vread is applied to all of the non-selected word lines WL. In the examples of reading operations shown in FIG. 9 and FIG. 10, the voltage Vread−β is applied to the non-selected word lines WLn+1 and WLn−1 adjoining the selected word line WLn on both sides, and the voltage Vread+β is applied to the non-selected word lines WLn+2 and WLn−2 adjoining the non-selected word lines WLn+1 and WLn−1 respectively. However, in the verify operation for reading whether or not data having the threshold voltage distribution A is written, the voltage Vread is applied to all of the non-selected word lines WL.

The voltage values specified above are mere examples in the reading operation, it is only necessary that the voltage values of the respective voltages to be applied to the word lines WL satisfy a relationship Vva<Vread.

As shown in FIG. 13 and FIG. 14, in a verify operation for reading whether or not data having the threshold voltage distribution B or C is written, the voltage Vvb (e.g., 1.5 V) or the voltage Vvc (e.g., 3.5 V) having the lower limit value of the threshold voltage B or C is applied to the selected word line WLn connected to the selected memory cell Mn. In the verify operation for reading whether or not data having the threshold voltage distribution B or C is written, the voltage Vread is applied to all of the non-selected word lines WL.

The voltage values specified above are mere examples in the reading operation, and it is only necessary that the voltage values of the respective voltages to be applied to the word lines WL satisfy a relationship Vvb<Vread and Vvc<Vread.

[Others]

While certain embodiments of the present invention have been described, the present invention is not limited to these embodiments, but various modifications, additions, combinations, etc. may be made without departing from the spirit of the inventions. For example, it is only necessary that the number of memory cells Mn connected in series between the select transistors ST1 and ST2 be a plural number, which is not limited to 32. The explanation has been based on the premise that the data to be stored in the memory cells is four-value data, but another-value data (e.g., two-value data or eight-value data) may be stored.

In the embodiment described above, when executing an E-A reading operation or an A-B reading operation, the voltages to be applied to the word lines WL are changed by using the adjusting voltages α and β. However, it is optional to change the voltages to be applied in a reading operation of applying a reading voltage between any two of the threshold voltage distributions. For example, it is possible to use the adjusting voltages α and β only when executing a reading operation by applying a voltage between the threshold voltage distributions E and A. It is also possible to change the voltages by using the adjusting voltages α and β in all types of reading operations.

Further, the embodiment has explained that it is in a reading operation of the NAND type flash memory that the selected word line voltage and the non-selected word line voltage are changed. However, this may be done in a writing verify operation. The intermediate value Va, Vb, or Vc may be set to a voltage obtained by subtracting from the writing verify voltage (the voltage Vva, Vvb, or Vvc) having the lower limit value of the threshold voltage distribution, an amount of change in the threshold voltage of the memory cell in a certain period of time due to leakage of charges accumulated in the floating gate electrode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
    a memory cell array including an array of NAND cell units, each of the NAND cell units further including a memory string and select transistors connected to both ends of the memory string, the memory string including a plurality of nonvolatile memory cells connected in series;
    word lines each connected to the nonvolatile memory cells;
    bit lines connected to first ends of the NAND cell units respectively;
    a source line connected to second ends of the NAND cell units; and
    a control circuit configured to select one of the nonvolatile memory cells as a selected memory cell to control a data reading operation on the selected memory cell,
    the nonvolatile memory cells being configured to have a plurality of threshold voltage distributions assigned to plural types of data to be stored therein, and
    the control circuit being configured to, when executing the data reading operation:
    apply to a selected word line, the selected word line being a word line connected to a selected memory cell, a first voltage obtained by adding a first adjusting voltage having a certain voltage value to an intermediate voltage between an upper limit value and a lower limit value of adjoining two of the threshold voltage distributions;
    apply to first non-selected word lines, the first non-selected word lines being word lines adjoining the selected word line, a second voltage obtained by subtracting a second adjusting voltage having a certain voltage value from a reading pass voltage for making the nonvolatile memory cells conductive regardless of a type of the plurality of threshold voltage distributions of the memory cells;
    apply to second non-selected word lines, the second non-selected word lines being word lines adjoining the first non-selected word lines, a third voltage obtained by adding the second adjusting voltage to the reading pass voltage; and
    apply to third non-selected word lines, the third non-selected word lines being non-selected word lines except the first non-selected word lines and the second non-selected word lines, the reading pass voltage.

2. The nonvolatile semiconductor memory device according to claim 1,
    wherein the first adjusting voltage is set to a voltage equal to or lower than a double of a product of a rate of capacitance coupling between the selected memory cell and the nonvolatile memory cell connected to one of the first non-selected word lines and the second adjusting voltage.

3. The nonvolatile semiconductor memory device according to claim 1,
    wherein the second adjusting voltage is set to a value which makes a voltage value of the second voltage higher than a voltage value of the first voltage, and makes a voltage value of the third voltage lower than a voltage value of a writing voltage to be applied to the selected word line in a writing operation.

4. The nonvolatile semiconductor memory device according to claim 1,
    wherein when the first voltage is lower than a certain value, the control circuit executes a reading operation by applying the first voltage to the selected word line, applying the second voltage to the first non-selected word lines, applying the third voltage to the second non-selected word lines, and applying the reading pass voltage to the third non-selected word lines, and
    when the first voltage is equal to or greater than the certain value, the control circuit executes a reading operation by applying the intermediate voltage between the upper limit value and the lower limit value of adjoining two of the threshold voltage distributions to the selected word line, and applying the reading pass voltage to the first non-selected word lines, the second non-selected word lines, and the third non-selected word lines.

5. The nonvolatile semiconductor memory device according to claim 1,
    wherein the nonvolatile memory cell is a memory cell having a stacked-gates configuration including: a tunnel insulating film formed above a semiconductor substrate; a floating gate electrode formed above the semiconductor substrate through the tunnel insulating film; an inter-gate insulating film formed above the floating gate electrode; and a control gate electrode formed above the floating gate electrode through the inter-gate insulating film.

6. The nonvolatile semiconductor memory device according to claim 1,
    wherein the first adjusting voltage is a voltage lower than the second adjusting voltage.

7. The nonvolatile semiconductor memory device according to claim 1,
    wherein in a verify operation after a data writing operation, the control circuit executes the verify operation by applying a voltage having a lower limit value of the threshold voltage distribution to the selected word line, and applying the reading pass voltage to the first non-selected word lines, the second non-selected word lines, and the third non-selected word lines.

8. A nonvolatile semiconductor memory device, comprising:
- a memory cell array including an array of NAND cell units, each of the NAND cell units further including a memory string and select transistors connected to both ends of the memory string, the memory string including a plurality of nonvolatile memory cells connected in series;
- word lines each connected to the nonvolatile memory cells;
- bit lines connected to first ends of the NAND cell units respectively;
- a source line connected to second ends of the NAND cell units; and
- a control circuit configured to select one of the nonvolatile memory cells as a selected memory cell to control a data reading operation on the selected memory cell,
- the nonvolatile memory cells being configured to have a first threshold voltage distribution, a second threshold voltage distribution, a third threshold voltage distribution, and a fourth threshold voltage distribution assigned to data of four values to be stored therein, the distributions having values ascending in an order of the first, second, third, and fourth threshold voltage distributions, and
- the control circuit being configured to, when executing the data reading operation:
- apply to a selected word line, the selected word line being a word line connected to the selected memory cell, a first voltage obtained by adding a first adjusting voltage having a certain voltage value to an intermediate voltage between an upper limit value and a lower limit value of adjoining two of the threshold voltage distributions;
- apply to first non-selected word lines, the first non-selected word lines being word lines adjoining the selected word line, a second voltage obtained by subtracting a second adjusting voltage having a certain voltage value from a reading pass voltage for making the nonvolatile memory cells conductive regardless of a type of the threshold voltage distributions of the memory cells;
- apply to second non-selected word lines, the second non-selected word lines being word lines adjoining the first non-selected word lines, a third voltage obtained by adding the second adjusting voltage to the reading pass voltage; and
- apply to third non-selected word lines, the third non-selected word lines being non-selected word lines except the first non-selected word lines and the second non-selected word lines, the reading pass voltage.

9. The nonvolatile semiconductor memory device according to claim 8,
- wherein the first adjusting voltage is set to a voltage equal to or lower than a double of a product of a rate of capacitance coupling between the selected memory cell and the nonvolatile memory cell connected to one of the first non-selected word lines and the second adjusting voltage.

10. The nonvolatile semiconductor memory device according to claim 8,
- wherein the second adjusting voltage is set to a value which makes a voltage value of the second voltage higher than a voltage value of the first voltage, and makes a voltage value of the third voltage lower than a voltage value of a writing voltage to be applied to the selected word line in a writing operation.

11. The nonvolatile semiconductor memory device according to claim 8,
- wherein when the first voltage is a voltage between the first threshold voltage distribution and the second threshold voltage distribution or when the first voltage is a voltage between the second threshold voltage distribution and the third threshold voltage distribution, the control circuit executes a reading operation by applying the first voltage to the selected word line, applying the second voltage to the first non-selected word lines, applying the third voltage to the second non-selected word lines, and applying the reading pass voltage to the third non-selected word lines, and
- when the first voltage is a voltage between the third threshold voltage distribution and the fourth threshold voltage distribution, the control circuit executes a reading operation by applying the intermediate voltage between the upper limit value and the lower limit value of adjoining two of the threshold voltage distributions to the selected word line, and applying the reading pass voltage to the first non-selected word lines, the second non-selected word lines, and the third non-selected word lines.

12. The nonvolatile semiconductor memory device according to claim 8,
- wherein the nonvolatile memory cell is a memory cell having a stacked-gates configuration including: a tunnel insulating film formed above a semiconductor substrate; a floating gate electrode formed above the semiconductor substrate through the tunnel insulating film; an inter-gate insulating film formed above the floating gate electrode; and a control gate electrode formed above the floating gate electrode through the inter-gate insulating film.

13. The nonvolatile semiconductor memory device according to claim 8,
- wherein the first adjusting voltage is a voltage lower than the second adjusting voltage.

14. The nonvolatile semiconductor memory device according to claim 8,
- wherein in a verify operation after a data reading operation, the control circuit executes the verify operation by applying a voltage having a lower limit value of the threshold voltage distribution to the selected word line, and applying the reading pass voltage to the first non-selected word lines, the second non-selected word lines, and the third non-selected word lines.

15. A nonvolatile semiconductor memory device, comprising:
- a memory cell array including an array of NAND cell units, each of the NAND cell units further including a memory string and select transistors connected to both ends of the memory string, the memory string including a plurality of nonvolatile memory cells connected in series;
- word lines each connected to the nonvolatile memory cells;
- bit lines connected to first ends of the NAND cell units respectively;
- a source line connected to second ends of the NAND cell units; and
- a control circuit configured to select one of the nonvolatile memory cells as a selected memory cell to control a data reading operation on the selected memory cell,
- the nonvolatile memory cells being configured to have a plurality of threshold voltage distributions assigned to plural types of data to be stored therein, and
- the control circuit being configured to, when executing the data reading operation:
- apply a first voltage having a first voltage value to a selected word line, the selected word line being a word line connected to the selected memory cell;
- apply a second voltage having a second voltage value higher than the first voltage value to first non-selected word lines, the first non-selected word lines being word lines adjoining the selected word line;

apply a third voltage having a third voltage value higher than the second voltage value to second non-selected word lines, the second non-selected word lines being word lines adjoining the first non-selected word lines; and apply a fourth voltage having a fourth voltage value higher than the second voltage value and lower than the third voltage value to third non-selected word lines, the third non-selected word lines being non-selected word lines except the first non-selected word lines and the second non-selected word lines.

16. The nonvolatile semiconductor memory device according to claim 15, wherein the first voltage value is a value obtained by adding a first adjusting voltage having a certain voltage value to an intermediate voltage between an upper limit value and a lower limit value of adjoining two of the threshold voltage distributions.

17. The nonvolatile semiconductor memory device according to claim 15, wherein the second voltage value is a value obtained by subtracting a second adjusting voltage having a certain voltage value from a reading pass voltage for making the nonvolatile memory cells conductive regardless of a type of the plurality of threshold voltage distributions of the memory cells, and the third voltage value is a value obtained by adding the second adjusting voltage to the reading pass voltage.

18. The nonvolatile semiconductor memory device according to claim 17, wherein the fourth voltage is the reading pass voltage.

19. The nonvolatile semiconductor memory device according to claim 15, wherein the third voltage value is set to a value lower than a voltage value of a writing voltage to be applied to the selected word line in a writing operation.

20. The nonvolatile semiconductor memory device according to claim 15, wherein the nonvolatile memory cell is a memory cell having a stacked-gates configuration including: a tunnel insulating film formed above a semiconductor substrate; a floating gate electrode formed above the semiconductor substrate through the tunnel insulating film; an inter-gate insulating film formed above the floating gate electrode; and a control gate electrode formed above the floating gate electrode through the inter-gate insulating film.

\* \* \* \* \*